United States Patent
Kim (10) Patent No.: US 10,013,190 B2
(45) Date of Patent: Jul. 3, 2018

(54) DATA STORAGE DEVICE

(71) Applicant: SK hynix Inc., Gyeonggi-do (KR)

(72) Inventor: Jee Yul Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 68 days.

(21) Appl. No.: 15/202,777

(22) Filed: Jul. 6, 2016

(65) Prior Publication Data

US 2017/0228176 A1    Aug. 10, 2017

(30) Foreign Application Priority Data

Feb. 5, 2016   (KR) .................. 10-2016-0014674

(51) Int. Cl.
| | |
|---|---|
| *G11C 29/00* | (2006.01) |
| *G06F 3/06* | (2006.01) |
| *G06F 11/10* | (2006.01) |
| *G11C 16/34* | (2006.01) |
| *G11C 29/52* | (2006.01) |

(52) U.S. Cl.
CPC .......... *G06F 3/0619* (2013.01); *G06F 3/0604* (2013.01); *G06F 3/0632* (2013.01); *G06F 3/0679* (2013.01); *G06F 11/1068* (2013.01); *G11C 16/3445* (2013.01); *G11C 29/52* (2013.01)

(58) Field of Classification Search
CPC .. G06F 3/0619; G06F 11/1068; G06F 3/0604; G06F 3/0632; G06F 3/0679; G11C 29/52
See application file for complete search history.

(56) References Cited

U.S. PATENT DOCUMENTS

| | | | | |
|---|---|---|---|---|
| 2005/0055621 | A1* | 3/2005 | Adelmann | G06F 11/1008 714/758 |
| 2006/0095825 | A1* | 5/2006 | Pan | G06F 11/1008 714/746 |
| 2011/0289385 | A1* | 11/2011 | Takeuchi | G06F 11/1068 714/764 |
| 2013/0198577 | A1* | 8/2013 | Oh | H03M 13/05 714/704 |

FOREIGN PATENT DOCUMENTS

KR    1020130070927    6/2013

* cited by examiner

*Primary Examiner* — Thien Nguyen
(74) *Attorney, Agent, or Firm* — IP & T Group LLP (57) ABSTRACT

A data storage device includes a first memory device including an operation information region for an original operation information, and suitable for performing a first initialization operation based on the original operation information and a controller suitable for performing a management operation to the original operation information, wherein the original operation information of the operation information region is prohibited from being changed until completion of the management operation.

17 Claims, 7 Drawing Sheets

DATA STORAGE DEVICE

CROSS-REFERENCES TO RELATED APPLICATION

The present application claims priority under 35 U.S.C. § 119(a) to Korean application number 10-2016-0014674, flied on Feb. 5, 2016, in the Korean Intellectual Property Office, which is incorporated herein by reference in its entirety.

BACKGROUND

1. Technical Field

Various embodiments generally relate to a data storage device and, more particularly, to a data storage device including a nonvolatile memory device.

2. Related Art

Data storage devices store data provided by an external device in response to a write request. Data storage devices may also provide stored data to an external device in response to a read request. Examples of external devices that use data storage devices include computers, digital cameras, cellular phones and the like. Data storage devices may be embedded in an external device during manufacturing of the external devices or may be fabricated separately and then connected afterwards to an external device.

SUMMARY

In an embodiment, a data storage device includes a first memory device including an operation information region for an original operation information, and suitable for performing a first initialization operation based on the original operation information and a controller suitable for performing a management operation to the original operation information, wherein the original operation information of the operation information region is prohibited from being changed until completion of the management operation.

In an embodiment, a data storage device may include: a first nonvolatile memory device; and a controller suitable for controlling the first nonvolatile memory device to perform a first initialization operation or a second initialization operation, wherein the first initialization operation is performed based on an original operation information, and the second initialization operation is performed based on a managed operation information, and wherein the first nonvolatile memory device checks reliability of the original operation information, and the controller checks reliability of the managed operation information.

In an embodiment, a data storage device may include: a first nonvolatile memory device including an operation information region for an original operation information; and a controller suitable for controlling the first nonvolatile memory device to perform a first initialization operation or a second initialization operation, wherein the first initialization operation is performed based on an original operation information, and the second initialization operation is performed based on a managed operation information managed through a management operation of the controller.

DETAILED DESCRIPTION

Hereinafter, a data storage device and an operating method thereof according to the present invention will be described with reference to the accompanying drawings through exemplary embodiments of the present invention. The present invention may, however, be embodied in different forms and should not be construed as being limited to the embodiments set forth herein. Rather, these embodiments are provided to describe the present invention in detail to the extent that a person skilled in the art to which the invention pertains can practice the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

Figure 1:
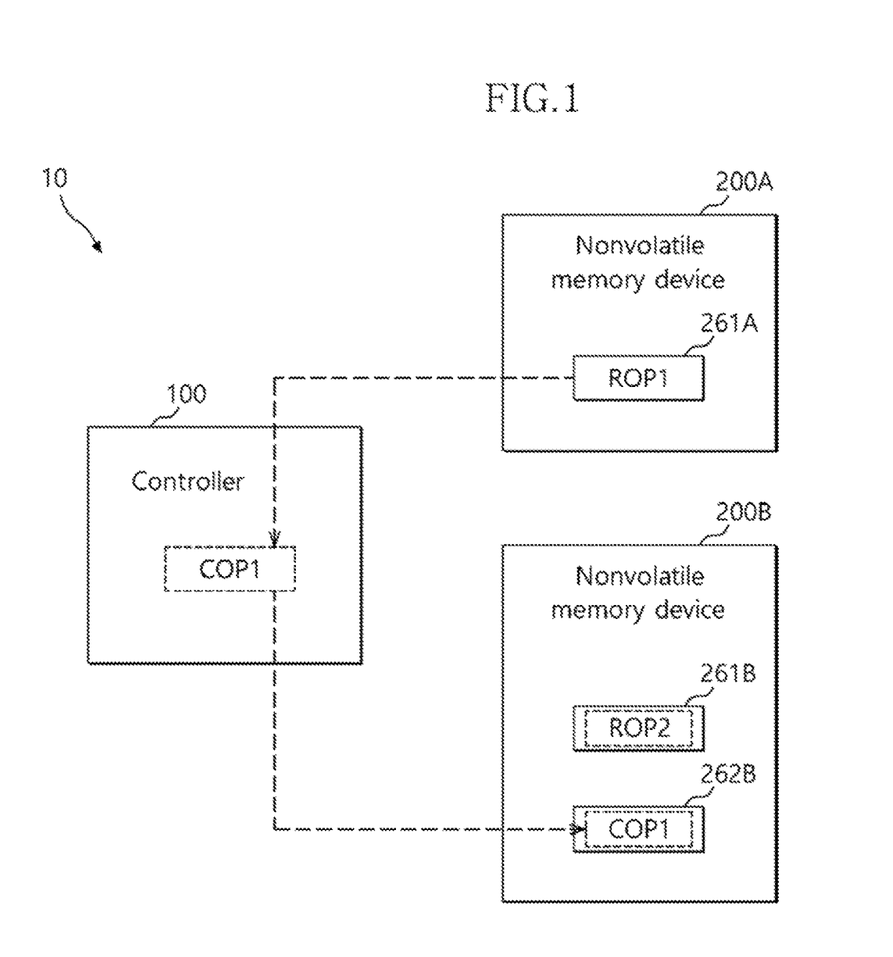
FIG. 1 is a block diagram illustrating a data storage device, according to an embodiment of the present invention.

Referring now to FIG. 1 a data storage device 10 is provided, according to an embodiment of the present invention.

According to the embodiment of FIG. 1, the data storage device 10 may store data provided from an external device (not shown) in response to a write request from the external device. Also, the data storage device 10 may provide stored data to the external device in response to a read request from the external device.

The data storage device 10 may, for example, be configured by a Personal Computer Memory Card International Association (PCMCIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD) and the like.

According to the embodiment of FIG. 1, the data storage device 10 includes a controller 100 and nonvolatile memory devices 200A and 200B.

The controller 100 may control one or more of the general operations of the data storage device 10. The controller 100 may store data in the nonvolatile memory devices 200A and 200B in response to a write request transmitted from the external device, and may read data stored in the nonvolatile memory devices 200A and 200B and output read data to the external device in response to a read request transmitted from the external device. While FIG. 1 shows 2 nonvolatile memory devices 200A and 200B, it is to be noted that the embodiment is not limited to such.

The controller 100 may perform a reliability management operation to original operation information ROP1 for the nonvolatile memory device 200A stored in an operation information region 261A of the nonvolatile memory device 200A.

For example, the controller 100 may generate managed operation information COP1 for the original operation information ROP1. For example, the controller 100 may generate the managed operation information COP1 by ECC-encoding the original operation information ROP1. The controller 100 may then check the reliability of the managed operation information COP1 as may be needed. For example, the controller 100 may check the reliability of the managed operation information COP1 by ECC-decoding the managed operation information COP1.

The controller 100 then stores the managed operation information COP1 in the nonvolatile memory device 200B. While it is exemplified in FIG. 1 that the managed operation information COP1 for the nonvolatile memory device 200A is stored in the nonvolatile memory device 200B, it is to be noted that, according to an embodiment, the managed operation information COP1 may be stored in a region other than the operation information region 261A of the nonvolatile memory device 200A. Meanwhile, while FIG. 1 exemplifies the reliability management operation to the original operation information ROP1 for the nonvolatile memory device 200A, it is to be noted that, according to an embodiment, the reliability management operation may also be performed to original operation information ROP2 for the nonvolatile memory device 200B in the same manner.

According to an embodiment, for improving the operation performance of the nonvolatile memory device 200B, the controller 100 may perform a background operation for data stored in the nonvolatile memory device 200B, such as, for example, a garbage collection operation, a wear leveling operation, a read reclaim operation and a backup operation. The controller 100 may also perform the background operation for the managed operation information COP1 stored in the nonvolatile memory device 200B, and the background operation may include the reliability check operation to the managed operation information COP1. That is to say, the reliability management operation may be performed as part of a background operation.

The original operation information ROP1 stored in the operation information region 261A may be prohibited from changing until the reliability management operation of the controller 100 is performed. If needed, the controller 100 may change (e.g., erase) the original operation information ROP1 in the operation information region 261A and use the operation information region 261A as an available memory region after completion of the reliability management operation. Hence, upon completion of the reliability management operation, the available memory space of the nonvolatile memory device 200A may be increased by erasing the original operation information ROP1 in the operation information region 261A and using the operation Information region 261A as an available memory region.

According to an embodiment, the data density of a memory region 262B for the managed operation Information COP1 may be greater than the data density of the operation information region 261A for the original operation Information ROP1 for securing greater available memory space of the nonvolatile memory device 200B.

The controller 100 may initialize the nonvolatile memory device 200A through one of first and second initialization operations. As will be described later, the first initialization operation may be performed based on the original operation information ROP1 read from the operation information region 261A, and the second initialization operation may be performed based on the managed operation Information COP1 managed through the reliability management operation of the controller 100. In other words, the first initialization operation may be performed based on the original operation information ROP1 the reliability of which is checked by the nonvolatile memory device 200A, and the second initialization operation may be performed based on the managed operation information COP1 the reliability of which is checked by the controller 100.

Before the reliability management operation, the controller 100 may control the nonvolatile memory device 200A to perform the first initialization operation. Namely, before the reliability management operation, the nonvolatile memory device 200A may perform the first initialization operation by checking by itself the reliability of the original operation information ROP1.

After the reliability management operation, the controller 100 may control the nonvolatile memory device 200A to perform the second initialization operation. That is to say, after the reliability management operation, the nonvolatile memory device 200A may perform the second initialization operation based on the managed operation information COP1 that is checked for reliability and then provided by the controller 100. In particular, in the case where the controller 100 erases the original operation information ROP1 of the operation Information region 261A and uses the operation information region 261A as the available memory region after completion of the reliability management operation, the nonvolatile memory device 200A may not any longer be initialized through the first initialization operation but may be initialized only through the second initialization operation.

The controller 100 may perform the reliability management operation to the original operation information ROP2 for the nonvolatile memory device 200B stored in an operation information region 261B of the nonvolatile memory device 200B, and may initialize the nonvolatile memory device 200B in the same manner as the nonvolatile memory device 200A. In this case, although not illustrated, the controller 100 may store the managed operation information COP2 for the nonvolatile memory device 200B in the nonvolatile memory device 200A. The controller 100 may independently initialize each of the nonvolatile memory devices 200A and 200B. For example, the controller 100 may control the nonvolatile memory device 200A to perform the second initialization operation based on the managed operation information COP1, and may control the nonvolatile memory device 200B to perform the first initialization operation based on the original operation information ROP2.

The reliability checking performance of the controller 100 may be better than the reliability checking performance of each of the nonvolatile memory devices 200A and 200B. For example, the controller 100 may have better error detection and correction capability than the nonvolatile memory device 200A. Therefore, the original operation information ROP1 may be managed more safely through the reliability management operation of the controller 100.

Each of the nonvolatile memory devices 200A and 200B may store data transmitted from the controller 100 and may read out stored data and transmit read-out data to the controller 100, according to control of the controller 100.

The nonvolatile memory devices 200A and 200B may include operation information regions 261A and 2618, in which the original operation information ROP1 and ROP2 for the nonvolatile memory devices 200A and 200B are stored, respectively. For example, the original operation information ROP1 may include parameters and option information necessary for the operation of the nonvolatile memory device 200A. The original operation information ROP1 may include information on a failed memory region and a repair memory region for replacing the failed memory region, which are generated as a result of testing the nonvolatile memory device 200A. The original operation information ROP1 may be generated and stored in the operation information region 261A when the nonvolatile memory device 200A is manufactured. Since the original operation information ROP1 is data necessarily needed for the operation of the nonvolatile memory device 200A, the original operation information ROP1 of the operation information region 261A may be basically prohibited from change and the operation information region 261A may have a low data density to secure reliability of the original operation information ROP1.

Each of the nonvolatile memory devices 200A and 200B may perform the first initialization operation or the second initialization operation under the control of the controller 100. For example, the nonvolatile memory device 200A may perform the first initialization operation by reading the original operation information ROP1 from the operation information region 261A, checking reliability of the read original operation information ROP1 and setting the reliability-checked original operation information ROP1. Further, the nonvolatile memory device 200A may perform the second initialization operation by receiving the managed operation information COP1 from the controller 100 according to the reliability management operation and setting the provided managed operation information COP1.

The nonvolatile memory devices 200A and 200B may each include a flash memory, such as NAND flash or NOR flash, Ferroelectrics Random Access Memory (FeRAM), Phase-Change Random Access Memory (PCRAM), Magnetoresistive Random Access Memory (MRAM), Resistive Random Access Memory (ReRAM), and the like.

Figure 2:
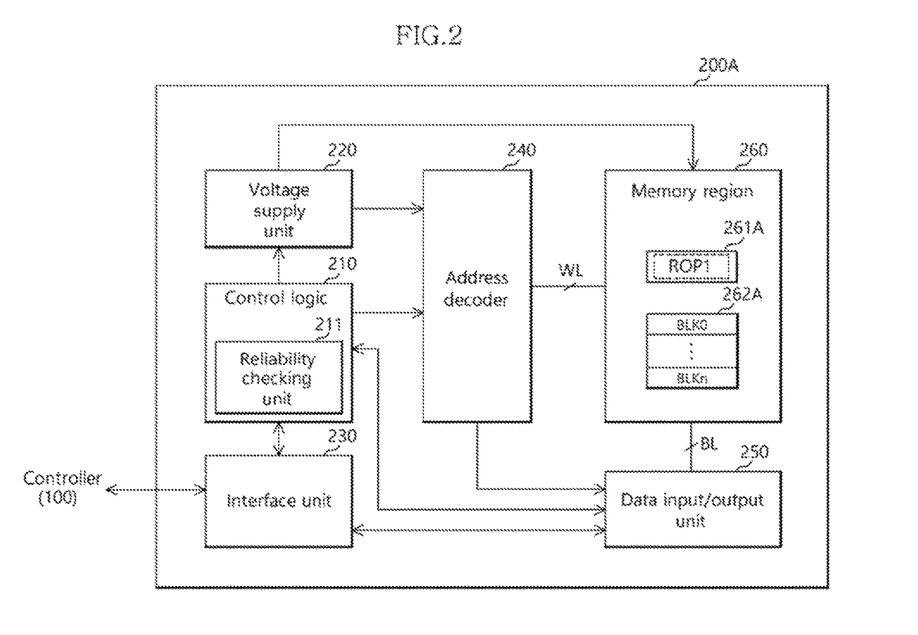
FIG. 2 is a block diagram illustrating an example of a detailed configuration of a nonvolatile memory device shown in FIG. 1.

FIG. 2 illustrates an example of a detailed configuration of a nonvolatile memory device 200A shown in FIG. 1. The nonvolatile memory device 200B of FIG. 1 may be configured and operate in substantially the same manner as the nonvolatile memory device 200A.

According to the embodiment of FIG. 2, the nonvolatile memory device 200A includes a control logic 210, a voltage supply unit 220, an interface unit 230, an address decoder 240, a data input/output unit 250, and a memory region 260.

The control logic 210 may control one or more of the general operations of the nonvolatile memory device 200A according to the control of the controller 100. The control logic 210 may receive a command transmitted from the controller 100, through the interface unit 230, and may transmit control signals to internal units of the nonvolatile memory device 200A in response to the command. The control logic 210 may perform the first initialization operation or the second initialization operation according to the control of the controller 100.

Figure 3:
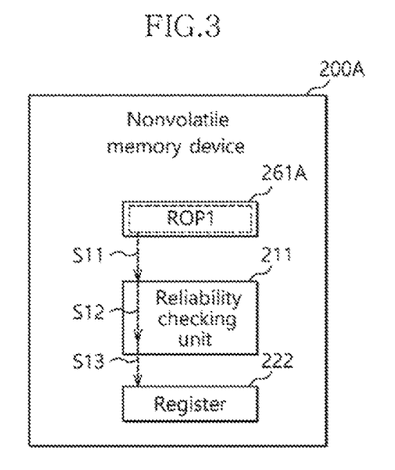
FIG. 3 is a schematic representation of an example to assist in the explanation of a first initialization operation of the nonvolatile memory device of FIG. 1, according to an embodiment of the present invention.

The control logic 210 may perform the first initialization operation by reading the original operation information ROP1 from the operation information region 261A, checking reliability for the read original operation information ROP1 and setting the reliability-checked original operation information ROP1 in an internal register of the memory device 200A (See e.g., register 222 of FIG. 3).

The control logic 210 may include a reliability checking unit 211. The reliability checking unit 211 may check the reliability of the original operation information ROP1 read from the operation information region 261A. Reliability checking may be performed through, for example, a majority check and/or a cyclic redundancy check.

The voltage supply unit 220 may generate various operation voltages necessary for the general operations of the nonvolatile memory device 200A, according to control of the control logic 210. For example, the voltage supply unit 220 may supply an erase voltage necessary for an erase operation, to the memory region 260. For example, the voltage supply unit 220 may supply various voltages to be used in write and read operations, to the address decoder 240.

The interface unit 230 provides an interface between the memory device 200A and the controller 100. Any suitable interface may be employed. The interface unit 230 may exchange various control signals including commands and addresses and data with the controller 100. The interface unit 230 may transmit various control signals and data inputted thereto, to the Internal units of the nonvolatile memory device 200A.

The address decoder 240 may decode addresses to select portions to be accessed in the memory region 260. The address decoder 240 may selectively drive word lines WL and control the data input/output unit 250 to selectively drive bit lines BL, according to decoding results.

The data input/output unit 250 may transmit data transmitted from the interface unit 230, to the memory region 260 through the bit lines BL. The data input/output unit 250 may transmit data read out from the memory region 260 through the bit lines BL, to the Interface unit 230. The data input/output unit 250 may sense current formed as memory cells included in the memory region 260 are turned on and off in response to a read voltage, and may obtain data read from the memory cells, according to sensing results.

The memory region 260 may be coupled with the address decoder 240 through the word lines WL, and may be coupled with the data input/output unit 250 through the bit lines BL. The memory region 260 may include a plurality of memory cells which are respectively disposed at areas where the word lines WL and the bit lines BL intersect with each other and in which data are stored. The memory region 260 may include memory cell arrays of a two-dimensional or three-dimensional structure.

The memory region 260 may include an available memory region 262A and the operation information region 261A. The available memory region 262A may include a plurality of memory blocks BLK0 to BLKn. For example, each memory block may be a unit by which the erase operation is performed. The operation information region 261A may be a region in which the original operation information ROP1 is stored. The operation information region 261A may include, for example, at least one memory block.

FIG. 3 is a schematic representation of an example assisting in the explanation of the first initialization operation of the nonvolatile memory device 200A. The nonvolatile memory device 200A may perform the first initialization operation according to control of the controller 100. The controller 100 may control the first initialization operation through an initialization command or signal, for example, upon power-on or by a request from a host.

According to the embodiment of FIG. 3, at step S11, the nonvolatile memory device 200A reads the original operation information ROP1 from the operation information region 261A.

At step S12, the nonvolatile memory device 200A, through the reliability checking unit 211 checks the reliability of the read original operation information ROP1.

Then, at step S13, the nonvolatile memory device 200A sets the original operation information ROP1, which has passed the reliability checking, in an internal register 222 of the nonvolatile memory device 200A.

Summarizing, a first initialization operation, according to the embodiment of FIG. 3, is performed based on the original operation information ROP1, the reliability of which is checked by the nonvolatile memory device 200A. If the original operation information ROP1 passes the reliability check, then the reliability-checked information is stored in an internal register of the non-volatile memory device 200A.

Figure 4:
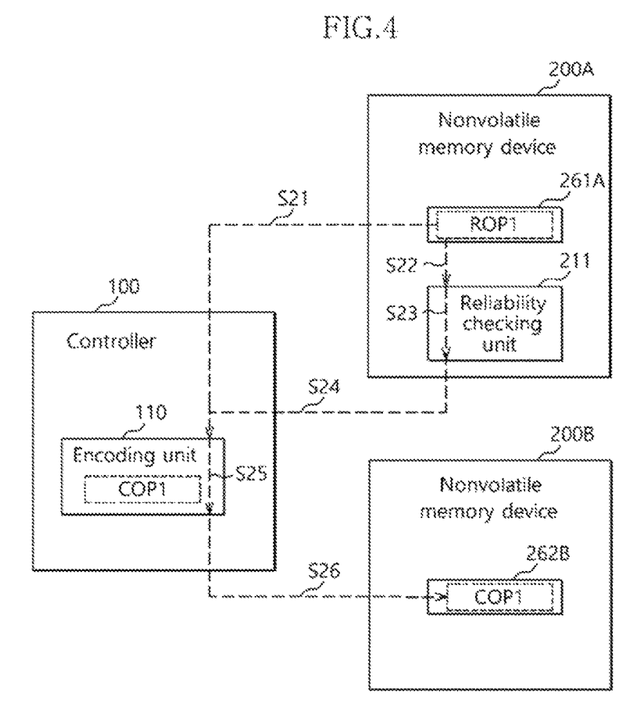
FIG. 4 is a schematic representation of an example assisting in the explanation of a reliability management operation of a controller of FIG. 1, according to an embodiment of the present invention.

FIG. 4 is a schematic representation of an example assisting in the explanation of the reliability management operation of the controller 100.

According to the embodiment of FIG. 4, at step S21, the controller 100 controls the nonvolatile memory device 200A to read the original operation information ROP1 and transmits the read original operation information ROP1 to the controller 100.

The controller 100 also controls the nonvolatile memory device 200A to perform steps S22 to S24. In detail, at step S22, the nonvolatile memory device 200A reads the original operation information ROP1 from the operation information region 261A according to the control of the controller 100. At step S23, the nonvolatile memory device 200A may check the reliability of the read original operation information ROP1. At step S24, the nonvolatile memory device 200A may transmit the reliability-checked original operation information ROP1 to the controller 100.

At step S25, the controller 100 generates the managed operation information COP1 based on the transmitted original operation information ROP1. For example, the controller 100 may generate the managed operation information COP1 by ECC-encoding the transmitted original operation information ROP1 through an ECC unit 110.

At step S26, the controller 100 may store the managed operation information COP1 in the memory region 262B of the nonvolatile memory device 200B.

According to an embodiment, the controller 100 may erase the original operation information ROP1 of the operation information region 261A and use the operation information region 261A as an available memory region after completion of the reliability management operation.

Figure 5:
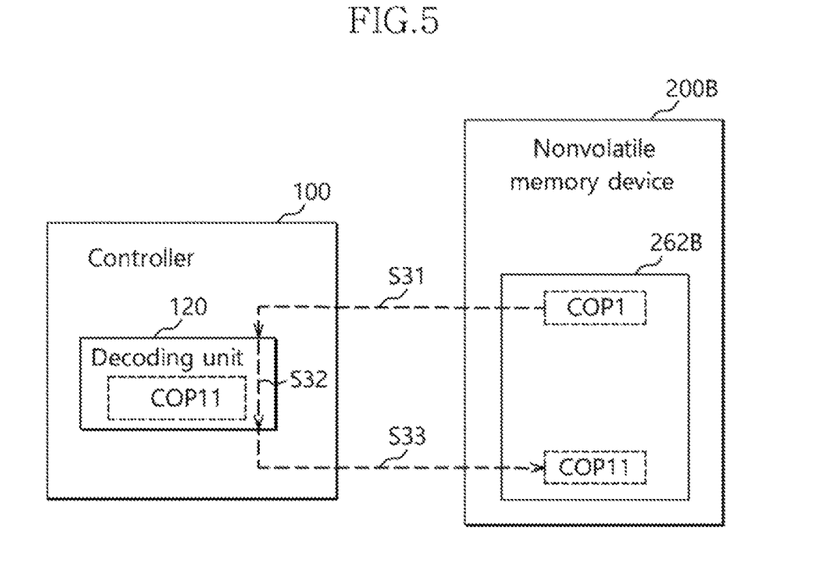
FIG. 5 is a schematic representation of an example assisting in the explanation of a reliability management operation of the controller of FIG. 1, according to an embodiment of the present invention.

FIG. 5 is a schematic representation of an example assisting in the explanation of a reliability management operation of the controller 100. The controller 100 may perform the reliability management operation, as a part of a background operation, to the managed operation information COP1 stored in the nonvolatile memory device 200B.

According to the embodiment of FIG. 5, at step S31, the controller 100 reads the managed operation information COP1 from the nonvolatile memory device 200B.

At step S32, the controller 100 may check the reliability of the managed operation information COP1. For example, the controller 100 may check the reliability of the managed operation information COP1 by ECC-decoding the managed operation information COP1 through a decoding unit 120 to generate reliability-checked operation information COP11.

At step S33, the controller 100 stores the reliability-checked operation information COP11 in the nonvolatile memory device 200B. For example, the controller 100 may store the error-corrected operation information COP11 when the reliability of the managed operation information COP1 is poor, that is, when an error occurrence rate of the managed operation information COP1 is high.

According to an embodiment, the controller 100 may retain the stored operation information COP1 instead of generating and storing the reliability-checked operation information COP11 when reliability of the managed operation information COP1 is still secured in the nonvolatile memory device 200B.

Figure 6:
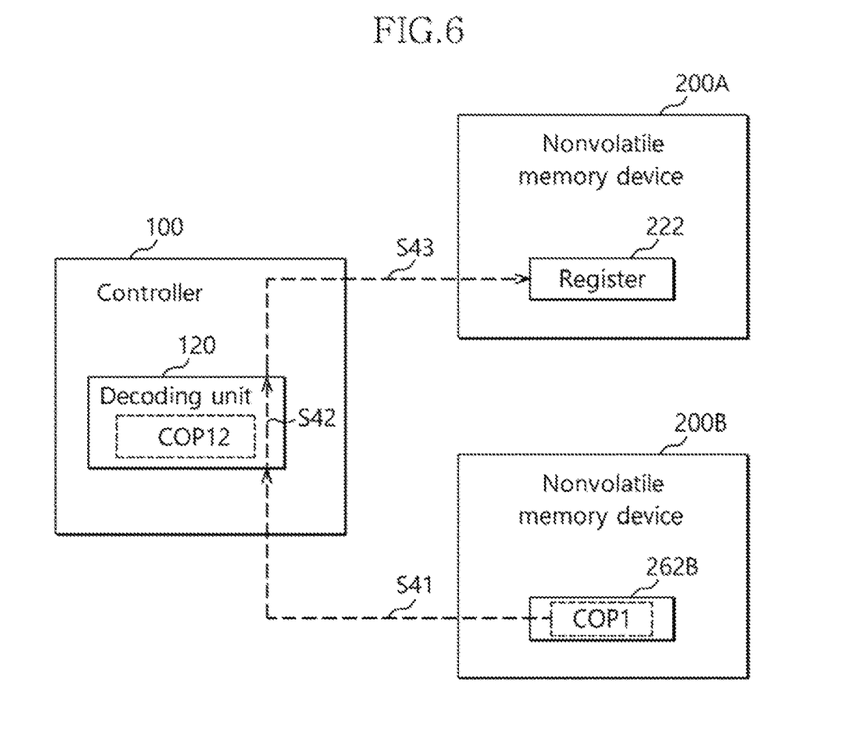
FIG. 6 is a schematic representation of an example assisting in the explanation of a second initialization operation of the nonvolatile memory device of FIG. 1, according to an embodiment of the present invention.

FIG. 6 is a schematic representation of an example assisting in the explanation of the second initialization operation of the nonvolatile memory device 200A.

At step S41, the controller 100 reads the managed operation information COP1 (or the reliability-checked operation information COP11 when generated as described with reference to FIG. 5).

At step S42, the controller 100 checks the reliability of the managed operation information COP1. For example, the controller 100 may check the reliability of the managed operation information COP1 by ECC-decoding the managed operation information COP1 through the decoding unit 120. The controller 100 may generate the reliability-checked operation information COP12 by detecting and correcting an error from the managed operation information COP1.

At step S43, the controller 100 transmit the reliability-checked operation information COP12 to the nonvolatile memory device 200A. The controller 100 may transmit together the reliability-checked operation information COP12 and the initialization command for the second initialization operation to the nonvolatile memory device 200A.

The nonvolatile memory device 200A may set the operation information COP12 transmitted from the controller 100 in the register 222 therein.

Figure 7:
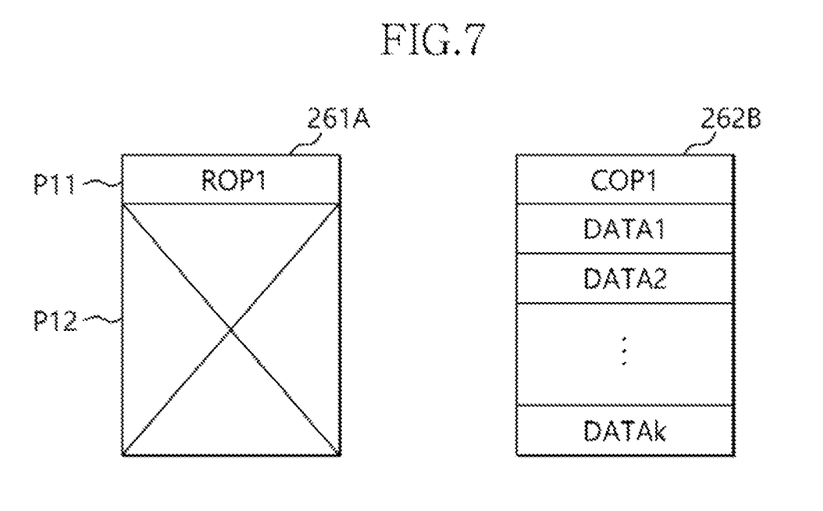
FIG. 7 is a schematic representation of examples of an operation information region for original operation information and a memory region for managed operation information, according to an embodiment of the present invention.

FIG. 7 is a diagram illustrating representations of examples of the operation information region 261A for the original operation information ROP1 and the memory region 262B for the managed operation information COP1. Each of the operation information region 261A and the memory region 262B may be, for example, a memory block.

Since, as described above, the original operation information ROP1 is data necessarily needed for the operation of the nonvolatile memory device 200A, various measures for ensuring reliability of the original operation information ROP1 may be provided. For example, the original operation information ROP1 may be checked for reliability thereof by the reliability checking unit 211, and the original operation information ROP1 of the operation information region 261A may be basically prohibited from change.

Moreover, according to the embodiment of FIG. 7, the operation information region 261A may have a low data density. In the operation information region 261A, only a predetermined partial region P11 is used to store the original operation information ROP1 while a remaining region P12 may be vacant or may be filled with dummy data. In this case, because an influence exerted on the original operation information ROP1 due to the remaining region P12 may not be concerned, the original operation information ROP1 may be retained safely in the operation information region 261A.

Conversely, the memory region 262B may have a data density higher than the operation information region 261A. The memory region 262B may be used entirely to store not only the managed operation information COP1 but also other meaningful data because the reliability of the managed operation information COP1 is managed by the controller 100 of higher reliability-ensuring capability and it is not necessary to further increase reliability of the managed operation information COP1 as high as that for the original operation information ROP1 in view of the data density.

As a result, when the original operation information ROP1 of the operation information region 261A is erased and the operation information region 261A becomes an available memory region after completion of the reliability management operation, the entire available memory capacity of the nonvolatile memory devices 200A and 200B may be increased.

Figure 8:
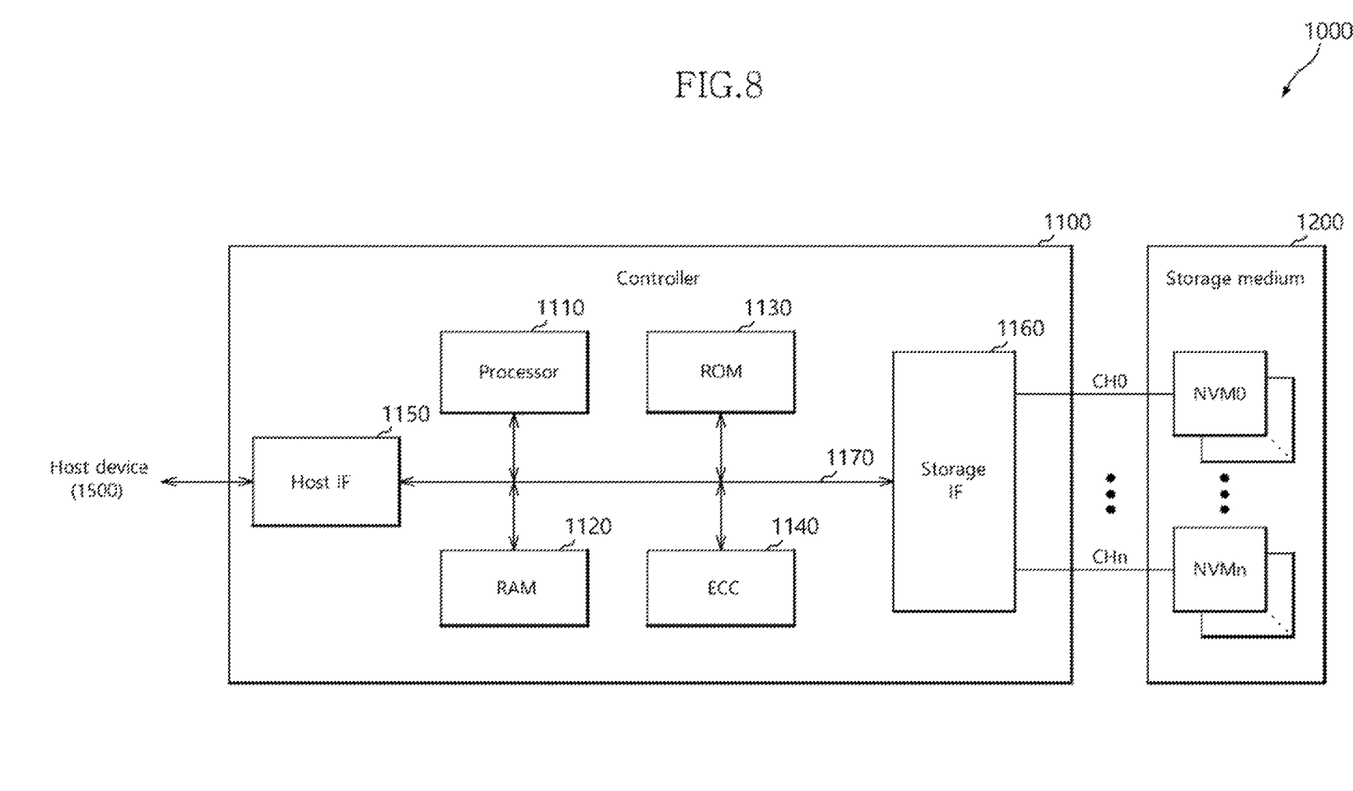
FIG. 8 is a block diagram illustrating an example of a solid state drive (SSD), according to an embodiment of the present invention.

FIG. 8 is a block diagram illustrating an example of a solid state drive (SSD) 1000, according to an embodiment of the present invention.

The controller 1100 may control data exchange between a host device 1500 and the storage medium 1200. The controller 1100 may include a processor 1110, a RAM 1120, a ROM 1130, an ECC unit 1140, a host interface 1150, and a storage medium interface 1160, operatively coupled via an internal bus 1170.

A controller 1100 may operate substantially similarly to the controller 100 shown in FIG. 1. The controller 1100 may perform the reliability management operation to original operation information of nonvolatile memory devices NVM0 to NVMn. The controller 1100 may erase the original operation information of the operation information regions and use the operation information regions as available memory regions, after completion of the reliability management operation. Also, the controller 1100 may control the nonvolatile memory devices NVM0 to NVMn to perform the first initialization operation or the second initialization operation. The controller 1100 may control the nonvolatile memory devices NVM0 to NVMn to perform the second initialization operation, by transmitting managed operation information managed through the reliability management operation.

The processor 1110 may control the general operations of the controller 1100. The processor 1110 may store data in the storage medium 1200 and read stored data from the storage medium 1200, according to data processing requests from the host device 1500. In order to efficiently manage the storage medium 1200, the processor 1110 may control internal operations of the SSD 1000 such as a merge operation, a wear leveling operation, and so forth.

Also, the processor 1110 may operate in a manner substantially similar to the control unit 110 shown in FIG. 1.

The RAM 1120 may store programs and program data to be used by the processor 1110. The RAM 1120 may temporarily store data transmitted from the host interface 1150 before transferring them to the storage medium 1200, and may temporarily store data transmitted from the storage medium 1200 before transferring them to the host device 1500.

The ROM 1130 may store program codes to be read by the processor 1110. The program codes may include commands to be processed by the processor 1110 for the processor 1110 to control the internal units of the controller 1100.

The ECC unit 1140 may encode data to be stored in the storage medium 1200, and may decode data read from the storage medium 1200. The ECC unit 1140 may detect and correct an error occurred in data, according to an ECC algorithm.

The host interface 1150 may exchange data processing requests, data, etc. with the host device 1500.

The storage medium interface 1160 may transmit control signals and data to the storage medium 1200. The storage medium interface 1160 may be transmitted with data from the storage medium 1200. The storage medium interface 1160 may be coupled with the storage medium 1200 through a plurality of channels CH0 to CHn.

A storage medium 1200 may include a plurality of nonvolatile memory devices NVM0 to NVMn. Each of the plurality of nonvolatile memory devices NVM0 to NVMn may perform a write operation and a read operation according to control of the controller 1100. Each of the nonvolatile memory devices NVM0 to NVMn may perform the first initialization operation or the second initialization operation according to control of the controller 1100, in the same manner as the nonvolatile memory device 200A shown in FIG. 1.

Figure 9:
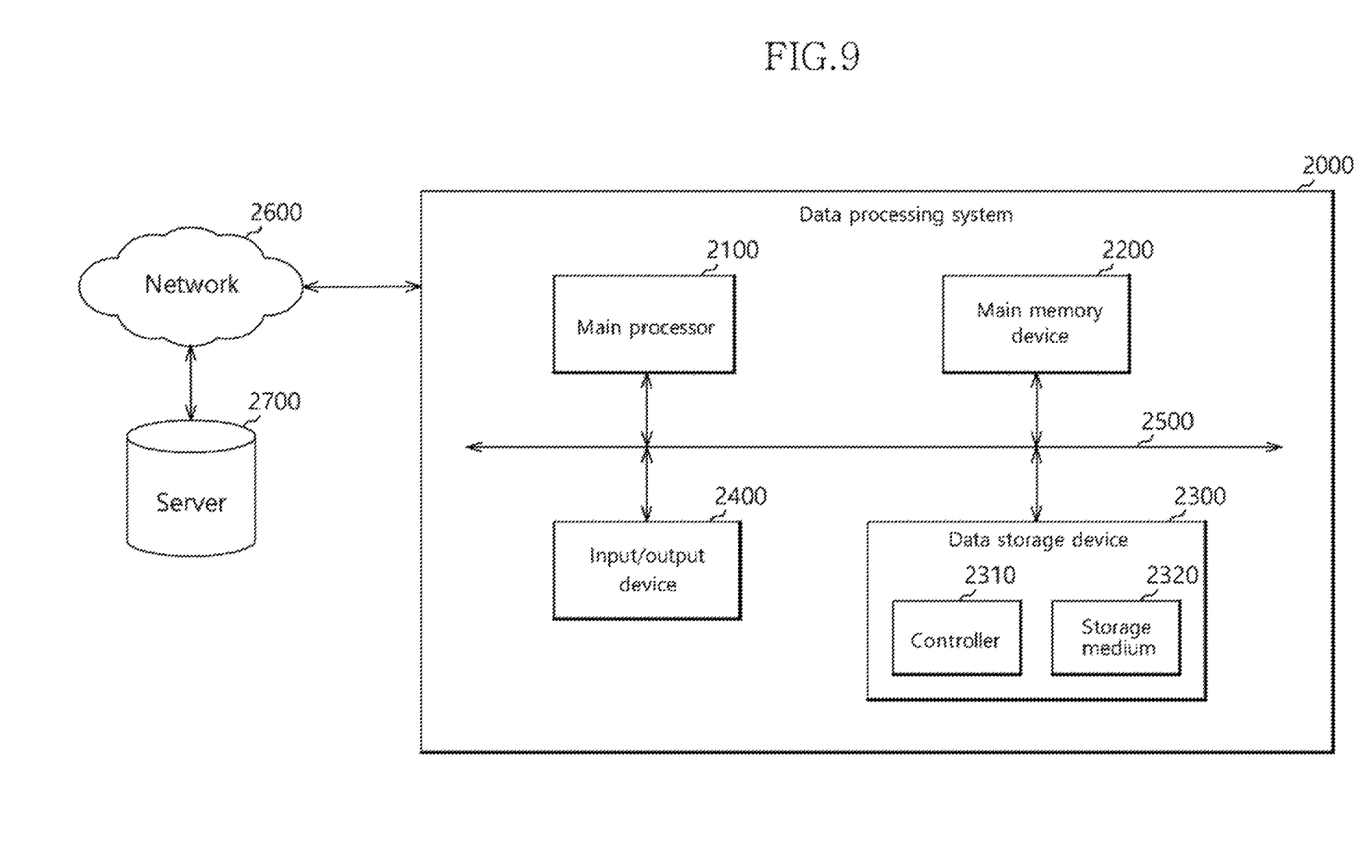
FIG. 9 is a block diagram illustrating an example of a data processing system to which a data storage device in accordance with an embodiment of the present invention is applied.

FIG. 9 is a block diagram illustrating an example of a data processing system 2000 to which the data storage device 2300 in accordance with the embodiment is applied. The data storage device 2300 may be the data storage device 10 of FIG. 1.

The data processing system 2000 may include a computer, a laptop, a netbook, a smart phone, a digital TV, a digital camera, a navigator, etc. The data processing system 2000 may include a main processor 2100, a main memory device 2200, a data storage device 2300, and an input/output device 2400. The internal units of the data processing system 2000 may exchange signals including data and control signals through a system bus 2500.

The main processor 2100 may control the general operations of the data processing system 2000. The main processor 2100 may be, for example, a central processing unit such as a microprocessor. The main processor 2100 may execute the software of an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured and operate in a manner substantially similar to the data storage device 10 shown in FIG. 1.

The input/output device 2400 may include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a LAN (local area network), a WAN (wide area network), a wireless network, and so on. The data processing system 2000 may include a network interface (not shown) to access the network 2600.

While various embodiments have been described above, it will be understood to those skilled in the art that the embodiments described are examples only. Accordingly, the data storage device and the operating method thereof described herein should not be limited based on the described embodiments. Many other embodiments and or variations thereof may be envisaged by those skilled in the relevant art without departing from the spirit and or scope of the present invention as defined in the following claims.

What is claimed is:

1. A data storage device comprising:
a first nonvolatile memory device including an operation information region for an original operation information, and suitable for performing a first initialization operation by reading the original operation information from the operation information region and checking reliability of the read original operation information; and
a controller suitable for performing a management operation by receiving the reliability-checked original operation information from the first nonvolatile memory device and generating a managed operation information based on the reliability-checked original operation information,
wherein the original operation information of the operation information region which is necessarily required for an operation of the first nonvolatile memory device is prohibited from being changed until completion of the management operation,
wherein, during the management operation, the controller generates the managed operation information by ECC-encoding the reliability-checked original operation information, and
wherein the controller checks reliability of the managed operation information by ECC-decoding the managed operation information during the management operation.

2. The data storage device according to claim 1, wherein the first nonvolatile memory device further performs the first initialization operation by setting the reliability-checked original operation information in a register thereof.

3. The data storage device according to claim 1, wherein the controller further erases the original operation information of the operation information region, and uses the operation information region as an available memory region after completion of the management operation.

4. The data storage device according to claim 1,
wherein the controller further controls the first nonvolatile memory device to perform a second initialization operation by checking reliability of the managed operation information managed through the management operation and setting the reliability-checked managed operation information.

5. The data storage device according to claim 4,
wherein, during the management operation, the controller controls the first nonvolatile memory device to read the original operation information from the operation information region, to check reliability of the read original operation information, and to transmit the reliability-checked original operation information to the controller.

6. The data storage device according to claim 4,
further comprising a second nonvolatile memory device, wherein the controller stores the managed operation information in a memory region included in at least one among the first and second nonvolatile memory devices.

7. The data storage device according to claim 6, wherein a data density of the memory region is greater than a data density of the operation information region.

8. A data storage device comprising:
a first nonvolatile memory device suitable for performing a first initialization operation and a second initialization operation; and
a controller suitable for controlling the first nonvolatile memory device and for performing a management operation on reliability-checked original operation information to generate a managed operation information,
wherein the first initialization operation is performed by checking reliability of the original operation information, and the second initialization operation is performed by checking reliability of the managed operation information managed through the management operation, and
wherein, during the management operation, the controller generates the managed information by ECC-encoding the reliability-checked original operation information.

9. The data storage device according to claim 8, wherein the first nonvolatile memory device includes an operation information region for storing the original operation information, and performs the first initialization operation by reading the original operation information from the operation information region, checking reliability for the read original operation information and setting the reliability-checked original operation information.

10. The data storage device according to claim 8,
wherein the first nonvolatile memory device includes an operation information region for storing the original operation information.

11. The data storage device according to claim 10,
wherein, during the management operation, the controller controls the first nonvolatile memory device to read the original operation information from the operation information region, to check reliability of the read original operation information, and to transmit the reliability-checked original operation information to the controller.

12. The data storage device according to claim 10,
wherein the controller transmits the reliability-checked managed operation information to the first nonvolatile memory device, and
wherein the first nonvolatile memory device performs the second initialization operation by setting the reliability-checked managed operation information.

13. The data storage device according to claim 10, wherein the controller further controls the first nonvolatile memory device to perform the second initialization operation after completion of the management operation.

14. A data storage device comprising:
a first nonvolatile memory device including an operation information region for an original operation information, and suitable for performing a first initialization operation and a second initialization operation; and
a controller suitable for controlling the first nonvolatile memory device and for performing a management operation which generates a managed operation information,
wherein the first operation is performed by checking reliability of the original operation information, and the second initialization operation is performed by checking reliability of the managed operation information,
wherein, during the management operation, the controller generates the managed operation information by ECGencoding the reliability-checked original operation information received from the first nonvolatile memory device, and wherein the controller further checks reliability of the managed operation information by ECC-decoding the managed operation information during the management operation.

15. The data storage device according to claim 14, wherein the first nonvolatile memory device performs the first initialization operation by reading the original operation information from the operation information region, checking reliability for the read original operation information and setting the reliability-checked original operation information.

16. The data storage device according to claim 14, wherein, during the management operation, the controller controls the first nonvolatile memory device to read the original operation information from the operation information region, to check reliability of the read original operation information, and to transmits the reliability-checked original operation information to the controller.

17. The data storage device according to claim 14, wherein the controller transmits the reliability-checked managed operation information to the first nonvolatile memory device, and wherein the first nonvolatile memory device performs the second initialization operation by setting the reliability-checked managed operation information.

* * * * *